United States Patent
Negishi et al.

(10) Patent No.: US 11,362,670 B2
(45) Date of Patent: Jun. 14, 2022

(54) RELU COMPRESSION TO REDUCE GPU MEMORY

(71) Applicant: INTERNATIONAL BUSINESS MACHINES CORPORATION, Armonk, NY (US)

(72) Inventors: Yasushi Negishi, Machida (JP); Tung D. Le, Ichikawa (JP); Haruki Imai, Yokohama (JP); Kiyokuni Kawachiya, Yokohama (JP)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 103 days.

(21) Appl. No.: 17/085,196

(22) Filed: Oct. 30, 2020

(65) Prior Publication Data

US 2022/0140841 A1 May 5, 2022

(51) Int. Cl.
*H03M 7/00* (2006.01)
*H03M 7/30* (2006.01)
(Continued)

(52) U.S. Cl.
CPC ........ *H03M 7/3066* (2013.01); *G06N 3/0481* (2013.01); *G06N 3/08* (2013.01);
(Continued)

(58) Field of Classification Search
CPC ............. H03M 7/3066; H03M 7/6005; H03M 7/6011; G06N 3/0481; G06N 3/08; G06T 1/20
(Continued)

(56) References Cited

U.S. PATENT DOCUMENTS

2014/0133772 A1\* 5/2014 Lee .................. G06T 9/004
382/238
2019/0205747 A1\* 7/2019 Srivastava ........... G06N 3/0454
(Continued)

OTHER PUBLICATIONS

Chen et al., "Eyeriss: An Energy-Efficient Reconfigurable Accelerator for Deep Convolutional Neural Networks", Session 14.5, Next-Generation Processing. Digest of Technical Papers. 2016 IEEE International Solid-State Circuits Conference. Feb. 2, 2016. pp. 262-264.

(Continued)

*Primary Examiner* — Jean B Jeanglaude
(74) *Attorney, Agent, or Firm* — Tutunjian & Bitetto, P.C.; Randall Bluestone

(57) ABSTRACT

A method is presented for compressing data of a Rectified Linear Unit (ReLU) function on a graphical processing unit (GPU) employed in a learning process of a deep neural network. The method includes converting an initial data structure including nonzero data and zero data into a compressed data structure including only the nonzero data of the initial data structure as compressed data by generating a nonzero data bitmap region, generating a nonzero data number table region by employing a parallel reduction algorithm, calculating a nonzero data array index per block region of all blocks from the nonzero data number table region by employing a parallel prefix sum scan algorithm, allocating a buffer for the compressed data; and copying the nonzero data from the initial data structure into a nonzero data array region in a compressed data format in parallel.

20 Claims, 10 Drawing Sheets

(51) Int. Cl.
*G06T 1/20* (2006.01)
*G06N 3/08* (2006.01)
*G06N 3/04* (2006.01)

(52) U.S. Cl.
CPC ............. *G06T 1/20* (2013.01); *H03M 7/6005* (2013.01); *H03M 7/6011* (2013.01)

(58) Field of Classification Search
USPC .................................................... 341/50, 51
See application file for complete search history.

(56) References Cited

U.S. PATENT DOCUMENTS

| 2019/0206090 | A1 | 7/2019 | Ray et al. | |
|---|---|---|---|---|
| 2019/0370642 | A1* | 12/2019 | Liu | ........................ G06N 3/063 |
| 2019/0370645 | A1 | 12/2019 | Lee et al. | |
| 2020/0143579 | A1* | 5/2020 | Sarel | ........................ G06N 3/08 |
| 2020/0175373 | A1* | 6/2020 | Demaj | ..................... G06N 3/04 |

OTHER PUBLICATIONS

Deshpande et al., "Fast Burrows Wheeler Compression using All-Cores", IEEE International Parallel and Distributed Processing Symposium Workshop. May 25, 2015. pp. 628-636.

Erdeljan et al., "IP Core for Efficient Zero-Run Length Compression of CNN Features Maps", 25th Telecommunication Forum. Nov. 21, 2017. pp. 1-4.

Funasaka et al., "Light Loss-Less Data Compression, With GPU Implementation", International Conference on Algorithms and Architectures for Parallel Processing. Dec. 14, 2016. pp. 281-294.

Han et al., "Deep Compression: Compressing Deep Neural Networks with Pruning, Trained Quantization and Huffman Coding", Published as a Conference Paper at ICLR 2016. arXiv:1510.00149v5. Feb. 15, 2016. pp. 1-14.

Han et al., "EIE: Efficient Inference Engine on Compressed Deep Neural Network", arXiv:1602.01528v2 [cs.CV]. May 3, 2016. pp. 1-12.

Mell et al., "The NIST Definition of Cloud Computing", National Institute of Standards and Technology, Special Publication 800-145, Sep. 2011. pp. 1-7.

Petta et al., "Multiparallel decompression simultaneously using multicore central processing unit and graphic processing unit", Journal of Applied Remote Sensing. vol. 7. Jul. 7, 2013. pp. 1-9.

Rozenberg et al., "Faster across the PCIe bus: A GPU library for lightweight decompression", Proceedings of the 13th International Workshop on Data Management on New Hardware. May 14, 2017. pp. 1-6.

Sitaridi et al., "Massively-Parallel Lossless Data Decompression", arXiv:1606.00519v1 [cs.DC] Jun. 2, 2016. pp. 1-10.

* cited by examiner

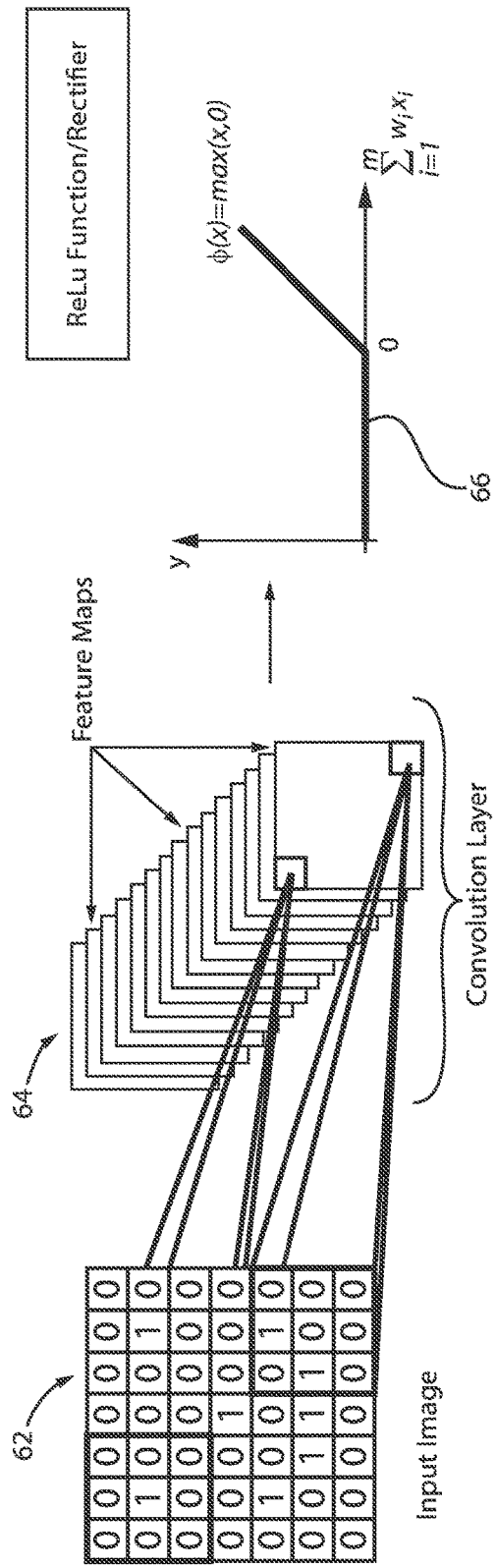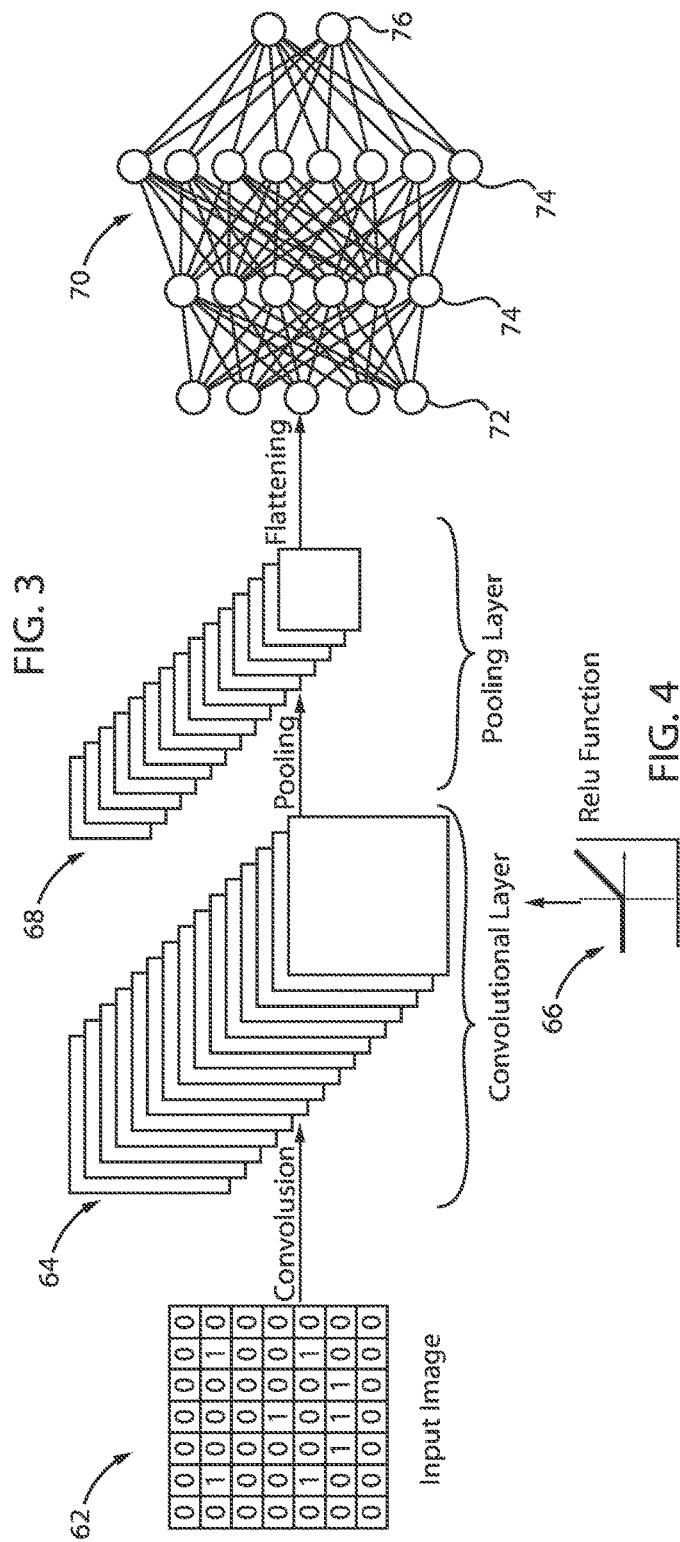
FIG. 3
FIG. 4

RELU COMPRESSION TO REDUCE GPU MEMORY

BACKGROUND

The present invention relates generally to compression of graphics processing unit (GPU) memory, and more specifically, to reducing GPU memory by rectified linear unit (ReLU) compression techniques.

A device can have one or more central processing units (CPUs) and one or more graphics processing units (GPUs). Each of the CPUs is a general-purpose processing device such as a microprocessor or another type of processor and is used for general computing tasks of the device. In addition, each of the GPUs is a specialized electronic circuit designed to rapidly manipulate and alter memory to accelerate the creation of images in a frame buffer intended for output to a display. Recently, these GPUs can be used as general-purpose computation on GPUs for a computer task. A general-purpose computation on GPUs is the utilization of a GPU, which usually handles computation only for computer graphics, to perform computation in processes traditionally handled by the CPU. For example, a GPU providing a functional set of operations performed on arbitrary bits can be used for general-purpose computation on GPUs.

GPU memory, however, is smaller than CPU memory in general, and GPU is sometimes not enough for large neural network models. Data transfer between CPU and GPU is relatively slow in comparison with a GPU's calculation speed. Thus, it can be difficult for GPUs to compress data effectively. Compression requires large amounts of computation, but it can be difficult to compress data on a GPU effectively because it is difficult to get enough parallelism for GPU.

SUMMARY

In accordance with an embodiment, a method is provided for compressing data of a Rectified Linear Unit (ReLU) function on a graphical processing unit (GPU) employed in a learning process of a deep neural network. The method includes converting an initial data structure including nonzero data and zero data into a compressed data structure including only the nonzero data of the initial data structure as compressed data by generating a "nonzero data bitmap" region, generating a "nonzero data number table" region by employing a parallel reduction algorithm, calculating a "nonzero data array index per block" region of all blocks from the "nonzero data number table" region by employing a parallel prefix sum scan algorithm, allocating a buffer for the compressed data; and copying the nonzero data from the initial data structure into a "nonzero data array" region in a compressed data format in parallel.

A non-transitory computer-readable storage medium comprising a computer-readable program is presented for compressing data of a Rectified Linear Unit (ReLU) function on a graphical processing unit (GPU) employed in a learning process of a deep neural network, wherein the computer-readable program when executed on a computer causes the computer to perform the steps of converting an initial data structure including nonzero data and zero data into a compressed data structure including only the nonzero data of the initial data structure as compressed data by generating a "nonzero data bitmap" region, generating a "nonzero data number table" region by employing a parallel reduction algorithm, calculating a "nonzero data array index per block" region of all blocks from the "nonzero data number table" region by employing a parallel prefix sum scan algorithm, allocating a buffer for the compressed data; and copying the nonzero data from the initial data structure into a "nonzero data array" region in a compressed data format in parallel.

A system for compressing data of a Rectified Linear Unit (ReLU) function on a graphical processing unit (GPU) employed in a learning process of a deep neural network is presented. The system includes a memory and one or more processors in communication with the memory configured to convert an initial data structure including nonzero data and zero data into a compressed data structure including only the nonzero data of the initial data structure as compressed data by generating a "nonzero data bitmap" region, generating a "nonzero data number table" region by employing a parallel reduction algorithm, calculating a "nonzero data array index per block" region of all blocks from the "nonzero data number table" region by employing a parallel prefix sum scan algorithm, allocating a buffer for the compressed data; and copying the nonzero data from the initial data structure into a "nonzero data array" region in a compressed data format in parallel.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein:

FIG. 3 is a diagram illustrating an exemplary convolutional neural network (CNN) with a rectified linear unit (ReLU) layer, in accordance with an embodiment of the present invention;

FIG. 4 is a diagram illustrating an exemplary deep learning CNN, in accordance with an embodiment of the present invention;

Throughout the drawings, same or similar reference numerals represent the same or similar elements.

DETAILED DESCRIPTION

Figure 1:
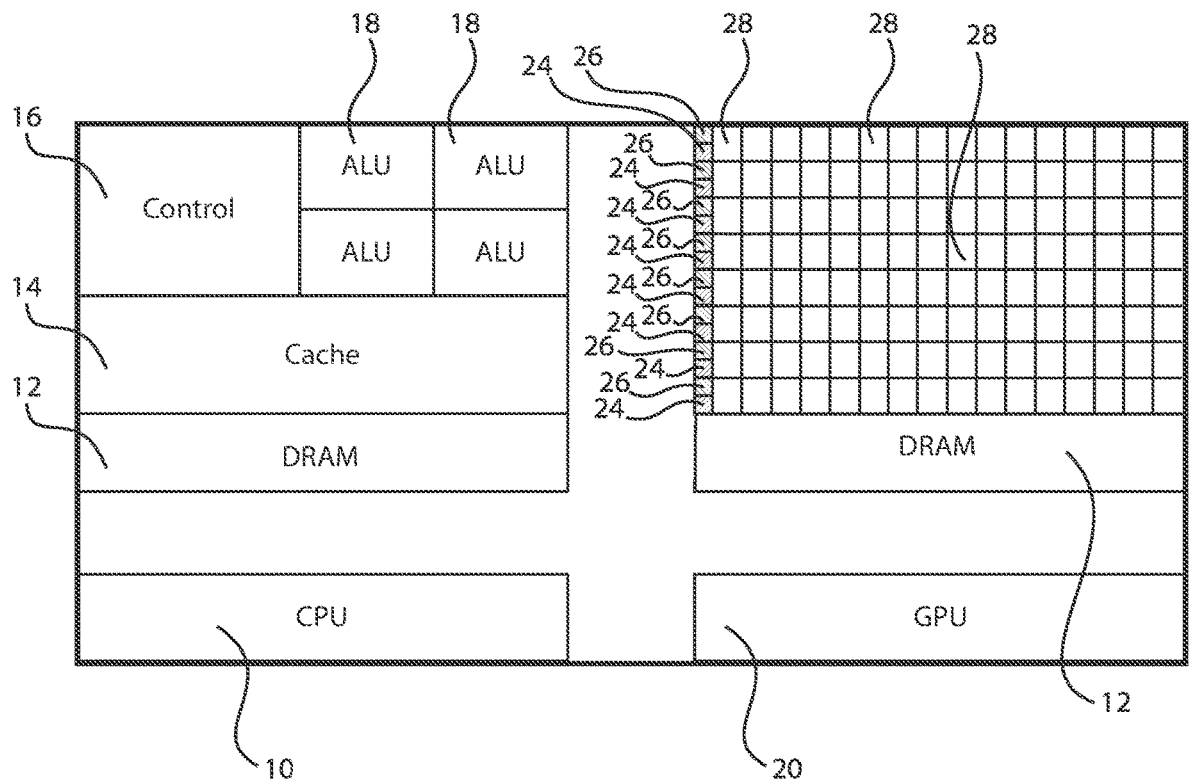
FIG. 1 is a diagram illustrating graphics processing unit (GPU) architecture versus central processing unit (CPU) architecture, in accordance with an embodiment of the present invention.

The exemplary embodiments of the present invention provide for compression of graphical processing unit (GPU) memory in deep learning (DL) models. DL models include several layers, such as convolution layers, rectified linear unit (ReLU) layers, pooling layers, fully connected (FC) layers, and loss layers (during the training process). The exemplary embodiments of the present invention employ compression/decompression techniques on the ReLU layers of the DL models. In particular, about half of the floating point numbers in outputs of the ReLU layers of the DL models are zero. ReLU outputs "zero" for all negative inputs. The exemplary embodiments of the present invention aim to eliminate the "0"s in the outputs of the ReLU layers and provide a bitmap to record the positions of the "0"s. Thus, compression/decompression techniques are focused on the elimination of such "zero data," where zero data means data designated as "0."

The exemplary embodiments of the present invention disclose a method and system that advantageously reduces GPU memory. In one exemplary method, ReLU compression is employed for GPU memory reduction where GPU memory is reduced by compressing feature maps generated by the ReLU. In another embodiment, ReLU compression is employed with a recomputation method to compress GPU memory by compressing and saving feature maps generated by ReLU layers for starting points of recomputation, and discarding other feature maps. In yet another embodiment, ReLU compression is employed with a data swapping method to compress GPU memory by compressing feature maps on the GPU generated by ReLU layers before transferring them into CPU memory. Thus, data transfer time from GPU to CPU can be efficiently reduced.

The exemplary embodiments of the present invention further include a compression system that generates a "nonzero data bitmap" in parallel, generates a "nonzero data number table" by employing a parallel reduction algorithm, calculates a "nonzero data array index per block" of all blocks from the "nonzero data number table" by employing a parallel prefix sum scan algorithm, allocates the buffer for compressed data, and copies nonzero data from the original data into a "nonzero data array," in parallel. The exemplary embodiments of the present invention further include a decompression system that allocates the buffer from the original data, and clears the buffer, calculates a "nonzero data array index per block" of all blocks from the "nonzero data number table" by employing a parallel prefix sum scan algorithm, and copies a "nonzero data array" from the original data according to the "nonzero data bitmap" data, in parallel.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this invention.

FIG. 1 is a diagram illustrating graphics processing unit (GPU) architecture versus central processing unit (CPU) architecture, in accordance with an embodiment of the present invention.

A CPU 10 works together with a GPU 20 to increase the throughput of data and the number of concurrent calculations within an application. GPUs were originally designed to create images for computer graphics and video game consoles, however, GPUs can also be used to accelerate calculations involving massive amounts of data (e.g., in DL models).

A CPU cannot be fully replaced by a GPU. GPU 20 complements CPU architecture 10 by allowing repetitive calculations within an application to be run in parallel while the main program continues to run on the CPU 10. The CPU 10 can be thought of as the taskmaster of the entire system, coordinating a wide range of general-purpose computing tasks, with the GPU 20 performing a narrower range of more specialized tasks (usually mathematical). Using the power of parallelism, GPU 20 can complete more work in the same amount of time as compared to the CPU 10.

The main difference between the CPU 10 and GPU architecture 20 is that the CPU 10 is designed to handle a wide-range of tasks quickly (as measured by CPU clock speed), but are limited in the concurrency of tasks that can be running. The GPU 20 is designed to quickly render high-resolution images and video concurrently.

Because GPUs can perform parallel operations on multiple sets of data, GPUs are also commonly used for non-graphical tasks such as machine learning and scientific computation. Designed with thousands of processor cores running simultaneously, GPUs enable massive parallelism where each core is focused on making efficient calculations.

While GPUs can process data several orders of magnitude faster than a CPU due to massive parallelism, GPUs are not as versatile as CPUs. CPUs have large and broad instruction sets, managing every input and output of a computer, which a GPU cannot do. While individual CPU cores are faster (as measured by CPU clock speed) and smarter than individual GPU cores (as measured by available instruction sets), the sheer number of GPU cores and the massive amount of parallelism that they offer more than make up the single-core clock speed difference and limited instruction sets.

As illustrated in FIG. 1, the CPU 10 can include a dynamic random-access memory (DRAM) 12, a cache 14, a control unit 16, and a few, e.g., 4 arithmetic logic units (ALUs) 18. In contrast, GPU 20 can include a DRAM 12, several cache 24, several control units 26, and a plurality of ALUs 28. Thus, the GPU architecture 20 is different than the CPU architecture 10 in that multiple cache 24 and control units 26 are employed in the GPU 20, and a significantly higher number of ALUs 28 are employed in the GPU 20.

Figure 2:
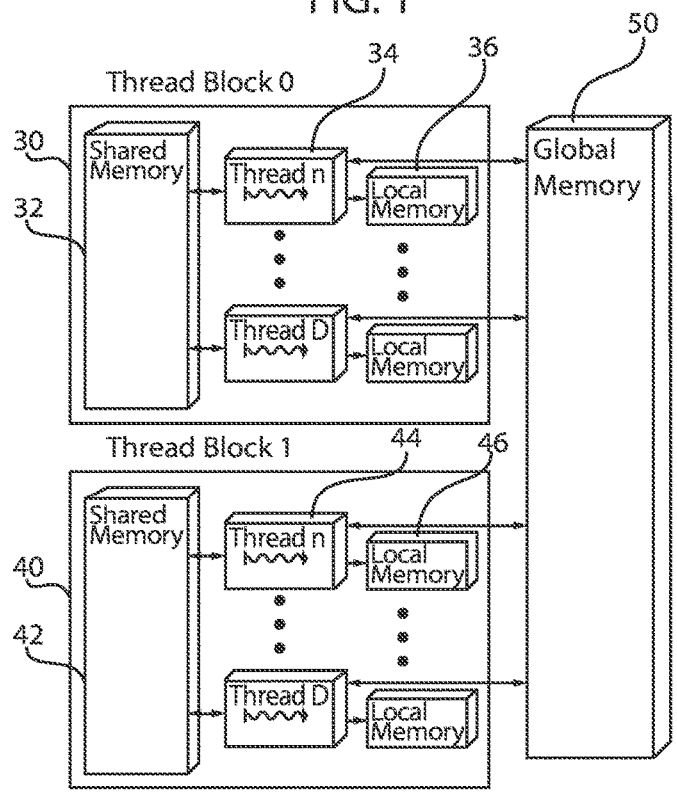
FIG. 2 illustrates an exemplary GPU memory, in accordance with an embodiment of the present invention.

FIG. 2 illustrates an exemplary GPU memory, in accordance with an embodiment of the present invention.

GPUs have evolved into general-purpose parallel execution machines. The general model of stream computing is each element in a set of streams, e.g., ordered sets of data, is processed by the same kernel, e.g., the set of functions to produce one or more streams as output. Each kernel is distributed on a set of GPU cores in the form of threads, each one executing concurrently the same program on a different set of data. Within this, threads are grouped into blocks and executed in sync. In case of a branching in the execution, the block is partitioned in two, then all the threads on the first branch are executed in parallel and eventually the same is done for all the threads on the second branch. This general model of parallel execution is often called single-instruction multiple-thread (SIMT) or single-program multiple-data (SPMD). Compared to the older single instruction, multiple data (SIMD), it allows greater flexibility in the flow of different threads.

GPU memory hierarchy is different compared to CPU memory hierarchy. In general, GPU memory space can be categorized in the following groups: register, constant memory, shared memory, texture memory, local memory, and global memory. In most GPU architectures, onboard memory (also called device memory) is organized in the following hierarchy: global memory 50, accessible by all threads 34, 44 in execution, shared memory 32, 42, a faster cache memory dedicated to each single thread block 30, 40 and local memory 36, 46 and/or registers, which are private to each thread 34, 44.

FIG. 3 is a diagram illustrating an exemplary convolutional neural network (CNN) with a rectified linear unit (ReLU) layer, in accordance with an embodiment of the present invention.

Convolutional neural networks (CNNs) are used in situations where data can be expressed as a "map" where the proximity between two data points indicates how related they are. An image is such a map, which is why CNNs are used in the context of image analysis. If an image is selected and all the pixels, of the image are randomly rearranged, the image is no longer recognizable. However, a relative position of the pixels to one another, that is, the order, is significant.

With that said, a CNN takes an image 62 expressed as an array of numbers, applies a series of operations to that array and, at the end, returns the probability that an object in the image belongs to a particular class of objects. CNNs include one or more of each of the following layers: convolution layer 64, rectified linear unit (ReLU) layer 66, pooling layer, fully connected (FC) layer, and loss layer (during the training process). CNNs process the image 62 using a matrix of weights called filters (or features or feature maps) that detect specific attributes such as diagonal edges, vertical edges, etc. Moreover, as the image 62 progresses through each layer, the filters are able to recognize more complex attributes.

The ReLU layer 66 commonly follows the convolution layer 64. The addition of the ReLU layer 66 allows the neural network to account for non-linear relationships, e.g., the ReLU layer 66 allows the CNN to account for situations in which the relationship between the pixel value inputs and the CNN output is not linear. Note that the convolution operation is a linear one. The output in the feature map is just the result of multiplying the weights of a given filter by the pixel values of the input and adding them up.

The purpose of applying the ReLU function 66 is to increase the non-linearity in the image 62. The reason for doing so is that the image 62 is naturally non-linear. When a person looks at any image, the person finds the image to include several non-linear features (e.g., the transition between pixels, the borders, the colors, etc.). The rectifier 66 serves to break up the linearity even further in order to make up for the linearity that one might impose an image when it is put through the convolution operation.

FIG. 4 is a diagram illustrating an exemplary deep learning CNN, in accordance with an embodiment of the present invention.

CNNs can also be referred to as ConvNets, which derive their name from the "Convolution Operation." The "convolution" 64 in case of ConvNet is to extract features from the input images 62. Convolution 64 preserves the spatial relationships between pixels by learning image features of input data. The output of the convolutional layer 64 is feature maps.

The pooling layer 68 contributes towards the ability of the CNN to locate features regardless of where they are in the image. In particular, the pooling layer 68 makes the CNN less sensitive to small changes in the location of a feature, e.g., the pooling layer 68 gives the CNN the property of translational invariance in that the output of the pooling layer 68 remains the same even when a feature is moved a little. Pooling also reduces the size of the feature map, thus simplifying computation in later layers. There are a number of ways to implement pooling, but the most effective in practice is max pooling.

Flattening is the process of converting all the resultant 2-dimensional arrays into a single long continuous linear vector.

The Fully Connected (FC) layer 70 is a traditional Multi-Layer Perceptron that uses a softmax activation function in the output layer. The term "Fully Connected" implies that every neuron in the previous layer is connected to every neuron on the next layer. The FC layer 70 includes an input layer 72, hidden layers 74, and an output layer 76. The output from the convolutional and pooling layers represent high-level features of the input image. The purpose of the FC layer 70 is to use these features for classifying the input image 62 into various classes based on the training dataset. The exemplary embodiments aim to compress GPU memory by employing compression techniques to the ReLU layer or rectifier 66.

Figure 5:
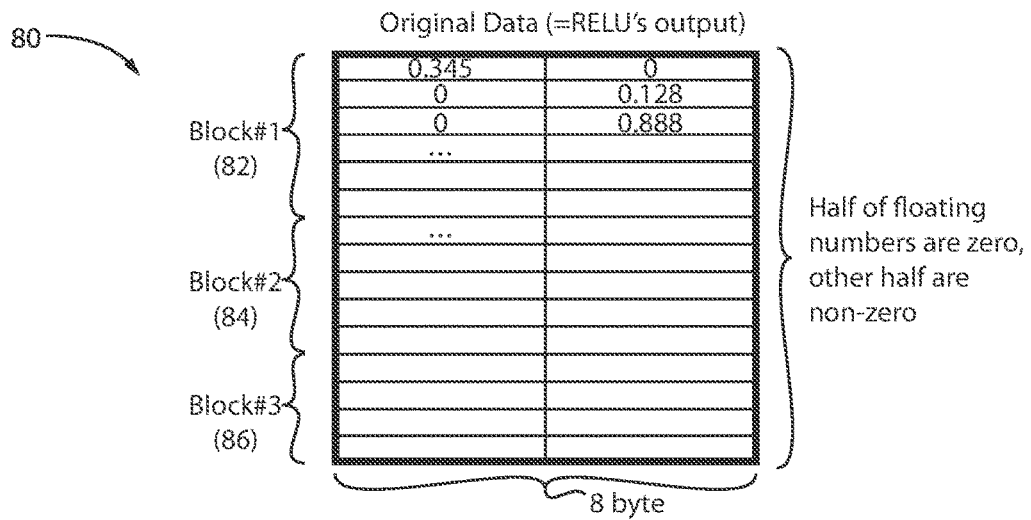
FIG. 5 is a diagram illustrating an exemplary data structure of uncompressed data input, in accordance with an embodiment of the present invention.

FIG. 5 is a diagram illustrating an exemplary data structure of uncompressed data input, in accordance with an embodiment of the present invention.

The data structure 80 is an exemplary data structure presented for illustrative purposes only and does not limit the invention in any way. The data structure 80 includes, e.g., two columns, the columns separated into, e.g., three blocks, that is block 82, block 84, and block 86. Each row in the columns includes floating numbers. Half the numbers can be zero and the other half of the numbers can be any nonzero numbers. Each column can hold, e.g., 4 bytes of data. Data structure 80 can be an original or initial uncompressed data structure.

Therefore, the exemplary embodiments of the present invention assume outputs of the ReLU layer are assumed as inputs and an array of single precision (e.g., 4 byte) floating-point numbers can be employed. The size of floating-point numbers can be, e.g., 1, 2, 4, 8 bytes. By the nature of the ReLU layer, about half of the floating-numbers are (exact) zero, and the other half are nonzero floating point numbers. The goal of the exemplary embodiments is to eliminate or remove the "0"s in the outputs and have a bitmap to record such positions. Thus, compression is focused on the elimination or removal of such "zero data," as detailed below with reference to FIG. 6.

Figure 6:
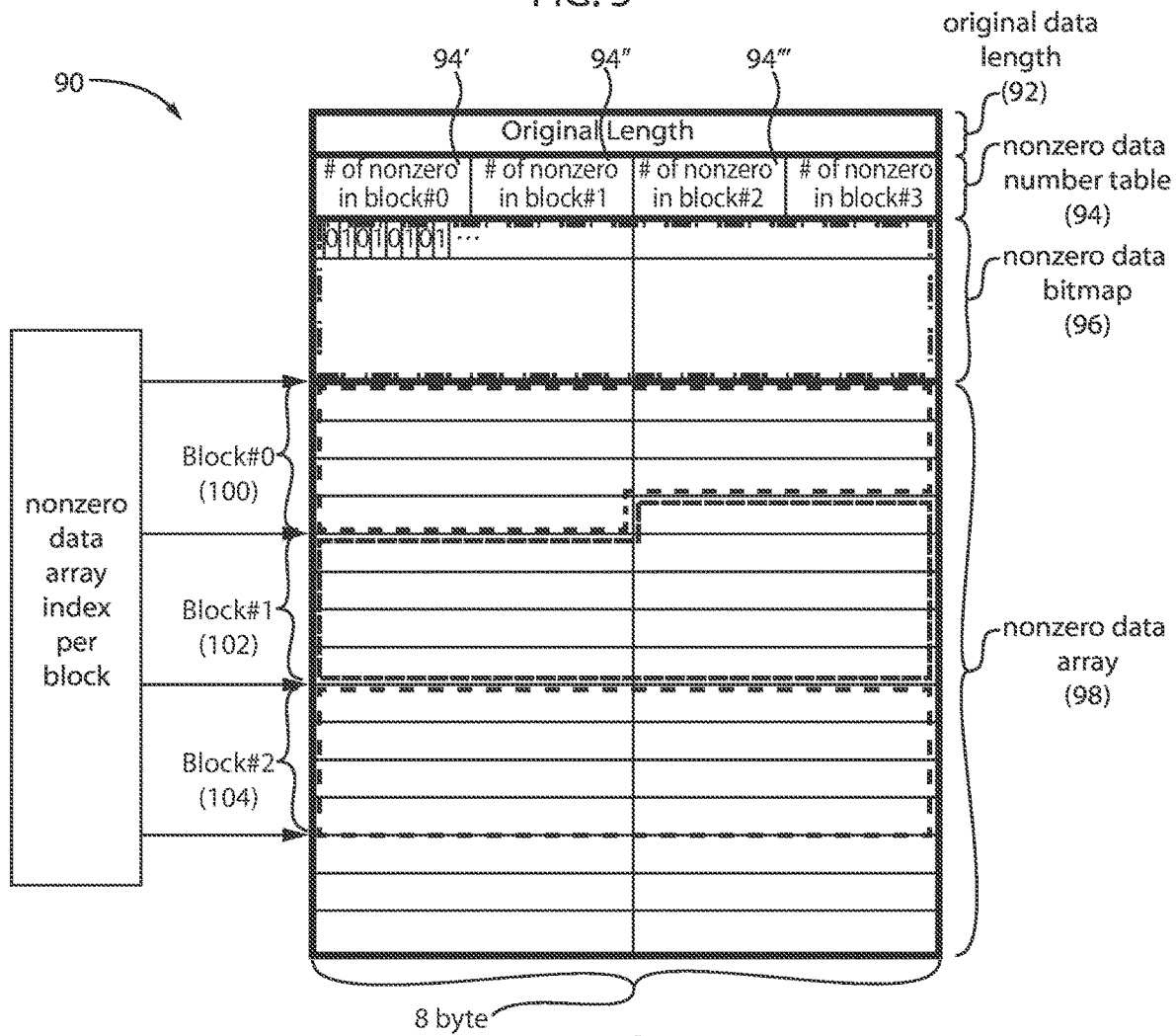
FIG. 6 is a diagram illustrating an exemplary data structure of compressed data, in accordance with an embodiment of the present invention.

FIG. 6 is a diagram illustrating an exemplary data structure of compressed data, in accordance with an embodiment of the present invention.

Before describing the modified data structure 90 with compressed data, certain observations are made. ReLU is a standard activation function in deep learning models, as shown in FIGS. 3 and 4 above. Most deep learning models have many ReLU functions 66. Half of floating point numbers in ReLU's outputs are zero. ReLU outputs "zero" for all negative inputs. GPU is a popular architecture for deep learning, but has special limitations for algorithms to utilize GPU cores. A large degree of parallelism is needed for practically effective execution. All threads should work with the same program (or algorithm). Synchronization among threads and blocks should be minimized. Generally speaking, it is difficult for a GPU to compress data effectively because it is difficult to parallelize to construct dictionaries for compression.

The motivation of the exemplary embodiments of the present invention is to introduce lossless compression on a GPU specific for ReLU's outputs (not for images or texts), by eliminating or removing "0"s in the outputs and having a bitmap to record their positions. The strategy is to design compression and decompression algorithms including highly parallel algorithms for GPUs. The focus is to compress/decompress the ReLU's outputs. The exemplary embodiments introduce algorithms to utilize GPU architecture by combining several parallel algorithms employed for GPUs.

Referring back to FIG. 6, the modified or adjusted or compressed data structure 90 includes an "original data length" block or region 92, a "nonzero data number table" region 94, a "nonzero data bitmap" region 96, and a "nonzero data array index per block" region 98 with block areas 100, 102, 104. The "nonzero data number table" region 94 includes a region 94' (# of nonzero in area 100), a region 94" (# of nonzero in area 102), a region 94''' (# of nonzero in area 104), etc.

The data is compressed/decompressed by a combination of a parallel reduction algorithm and a parallel prefix sum algorithm, which can utilize GPU cores effectively. The data structure uses a simple lossless compression format specific to the ReLU's outputs (does not support images or texts). This restriction makes the compression algorithm and data structures simple, and enables the use of parallel algorithms with a large degree of parallelism for compression. As a result, the structure 90 of the compressed data includes the following regions: original data length 92 (optional), which is a length of the original data, nonzero data number table 94, which is a number of nonzero data in each block, nonzero data bitmap 96, which is a bitmap indicating nonzero data positions, and nonzero data array 98, which is an array of nonzero data in the original or uncompressed data.

The GPU cores are utilized by employing a parallel reduction algorithm to generate a "nonzero number per block table" and a parallel prefix sum scan algorithm to calculate a "starting index of nonzero data array of all blocks." The parallel reduction algorithm can be an algorithm provided by, e.g., NVIDIA®. Parallel reduction works by using half the number of threads of the elements in the dataset. Every thread calculates the minimum of its own element and some other element. The resultant element is forwarded to the next round. The number of threads is then reduced by half and the process is repeated until there is just a single element remaining, which is the result of the operation.

Regarding the compression algorithm, first the method generates the "nonzero data bitmap" region in parallel. Then the method generates the "nonzero data number table" region by employing a parallel reduction algorithm. Subsequently the method calculates the "nonzero data array index per block" region of all blocks from the "nonzero data number table" by employing a parallel prefix sum scan algorithm. The method then allocates the buffer for compressed data. Finally, the method copies the nonzero data from the original or initial input data into a "nonzero data array" region, in parallel. Parallel prefix sum, also known as parallel Scan, is a useful building block for many parallel algorithms including sorting and building data structures. Both the parallel reduction algorithm and the parallel prefix sum scan algorithm are compatible with CUDA, CUDA being a parallel computing platform and application programming interface model created by NVIDIA®. CUDA allows software developers and software engineers to use a CUDA-enabled graphics processing unit for general purpose processing, an approach termed GPGPU.

Regarding the decompression algorithm, the method first allocates the buffer for original data, and then clears the buffer. Next, the method calculate the "nonzero data array index per block" region of all blocks from the "nonzero data number table" region by employing a parallel prefix sum scan algorithm. Finally, the method copies the "nonzero data array" region into the original data according to the "nonzero data bitmap" region in parallel.

Moreover, it is noted that the "nonzero data bitmap" region 96 is displayed directly above the "nonzero data array index per block" region 98 in the compressed data structure 90. The "nonzero data number table" region 94 is displayed directly above the "nonzero data bitmap" region 96 in the compressed data structure 90. Also, the "nonzero data bitmap" region 96 displays the uncompressed data 200 (FIGS. 7 and 8) in binary format (1s and 0s) in a sequential manner. The sequence of binary digits extends in a horizontal manner from left to right within the "nonzero data bitmap" region 96. Moreover, the blocks 94', 94", 94''' are displayed in a single row of the "nonzero data number table" region 94. Areas or blocks 100, 102, 104 can have different sizes, including rectangular and non-rectangular sizes.

Figure 7:
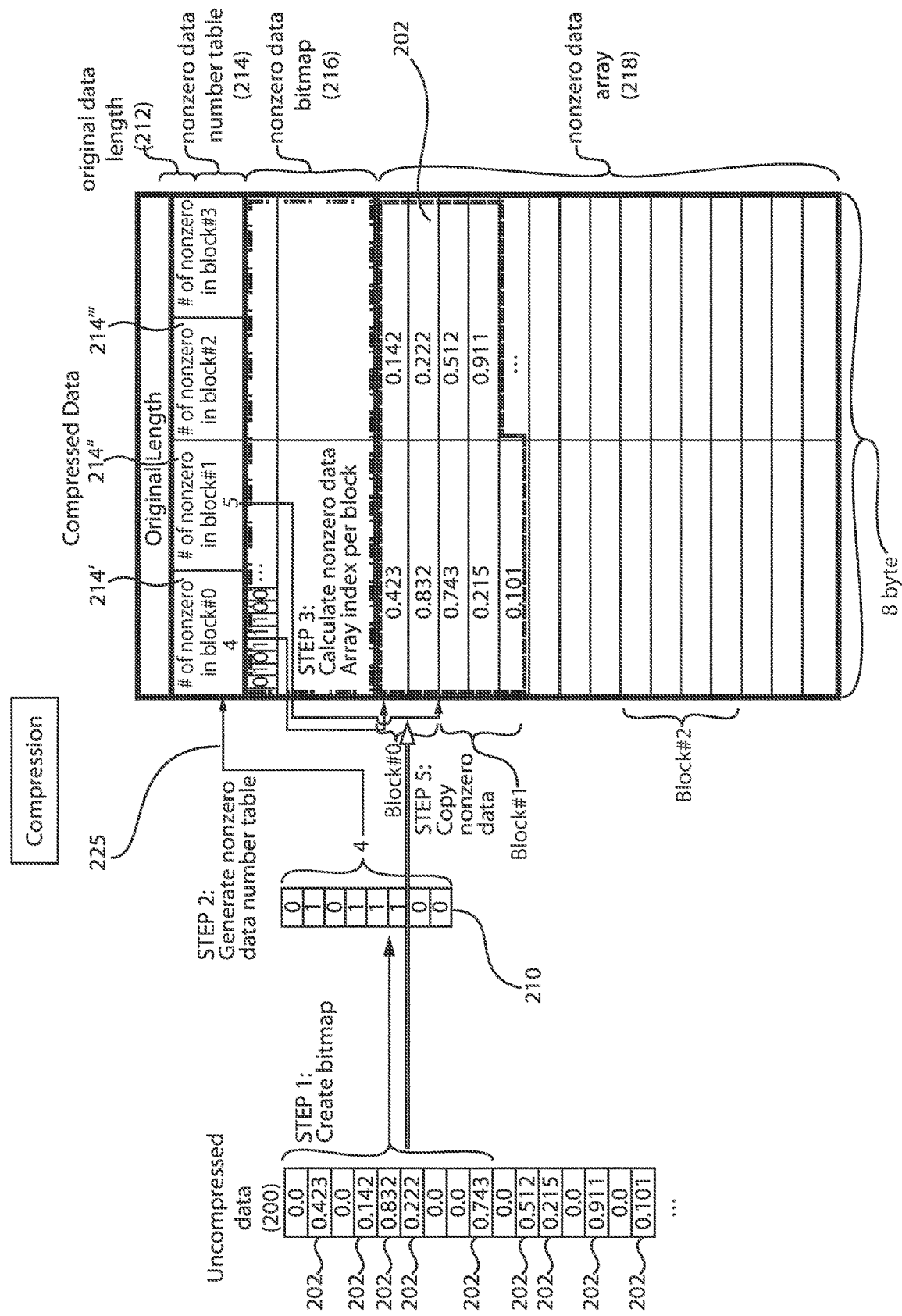
FIG. 7 is a diagram illustrating an exemplary compression algorithm methodology, in accordance with an embodiment of the present invention.

FIG. 7 is a diagram illustrating an exemplary compression algorithm methodology, in accordance with an embodiment of the present invention.

When executing the compression algorithm, the uncompressed data 200 is converted into a bitmap 210 by generating a "nonzero data number" table 214, as shown by arrow 225. The nonzero data in the uncompressed data 200 is designated as 202. The bitmap 210 represents the uncompressed data 200 in binary format. A "0" corresponds to all "zero data" and a "F" corresponds to all positive non-zero data. The bitmap 210 is mapped into the "nonzero data bitmap" 216. The "nonzero data number" table 214 is formed in a single row and includes several boxes or areas, where each area indicates a number of the nonzeros in each block. The first area 214' indicates 4 nonzeros in block #0, the second area 214" indicates 5 nonzeros in block #1, the third area 214''' is being processed to determine the exact number of nonzeros in block #2. This is accomplished by employing a parallel reduction algorithm. In the next step (step 3), a "nonzero data array index per block" 218 of all blocks is calculated from the "nonzero data number" table 214 by employing a parallel prefix sum scan algorithm. Then the buffer is allocated for compressed data. Finally, in step 5, the nonzero data 202 is copied from the original data (in the uncompressed data 200) into the "nonzero data array" 218. The compressed data structure further includes an "original data length" region 212 at a topmost portion thereof. Region 212 can be optional.

Figure 8:
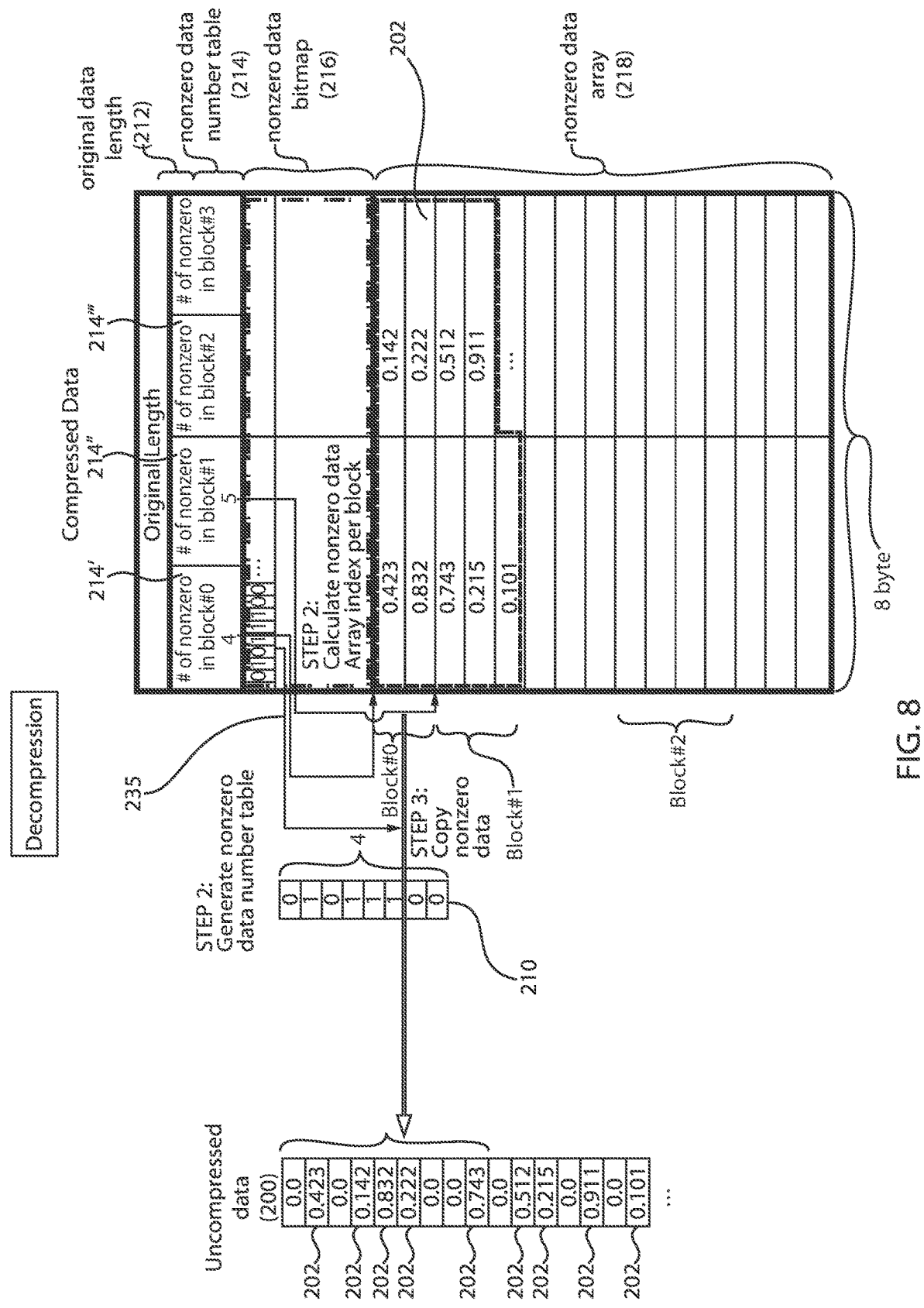
FIG. 8 is a diagram illustrating an exemplary decompression algorithm methodology, in accordance with an embodiment of the present invention.

FIG. 8 is a diagram illustrating an exemplary decompression algorithm methodology, in accordance with an embodiment of the present invention.

When executing the decompression algorithm, the buffer is allocated from the original data and the buffer is then cleared. In the next step, the "nonzero data array index per block" of all blocks is calculated from the "nonzero data number table" by employing the parallel prefix sum scan algorithm. Finally, in step 3, the "nonzero data array" is copied into the original data according to the "nonzero data bitmap" data, in parallel. This is indicated by arrow 235. The first area 214' indicates 4 nonzeros (or nonzero entries) in block #0, the second area 214" indicates 5 nonzeros (or nonzero entries) in block #1, the third area 214''' is being processed to determine the exact number of nonzeros in block #2. As a result, the "zero data" or data indicated as "0" have been removed when putting together the compressed data structures shown in FIGS. 6-8.

Thus, the exemplary embodiments of the present invention support both compression and decompression of outputs of the ReLU layers, which are employed in most DL models. The target hardware for the exemplary methods is the GPU, which supports both the learning phase and the inference shape. Additionally, the exemplary methods provide for lossless compression and maintain the original DL models. The exemplary methods can thus utilize GPU better with higher parallelism due to the nature of outputs of the ReLU layers.

Figure 9:
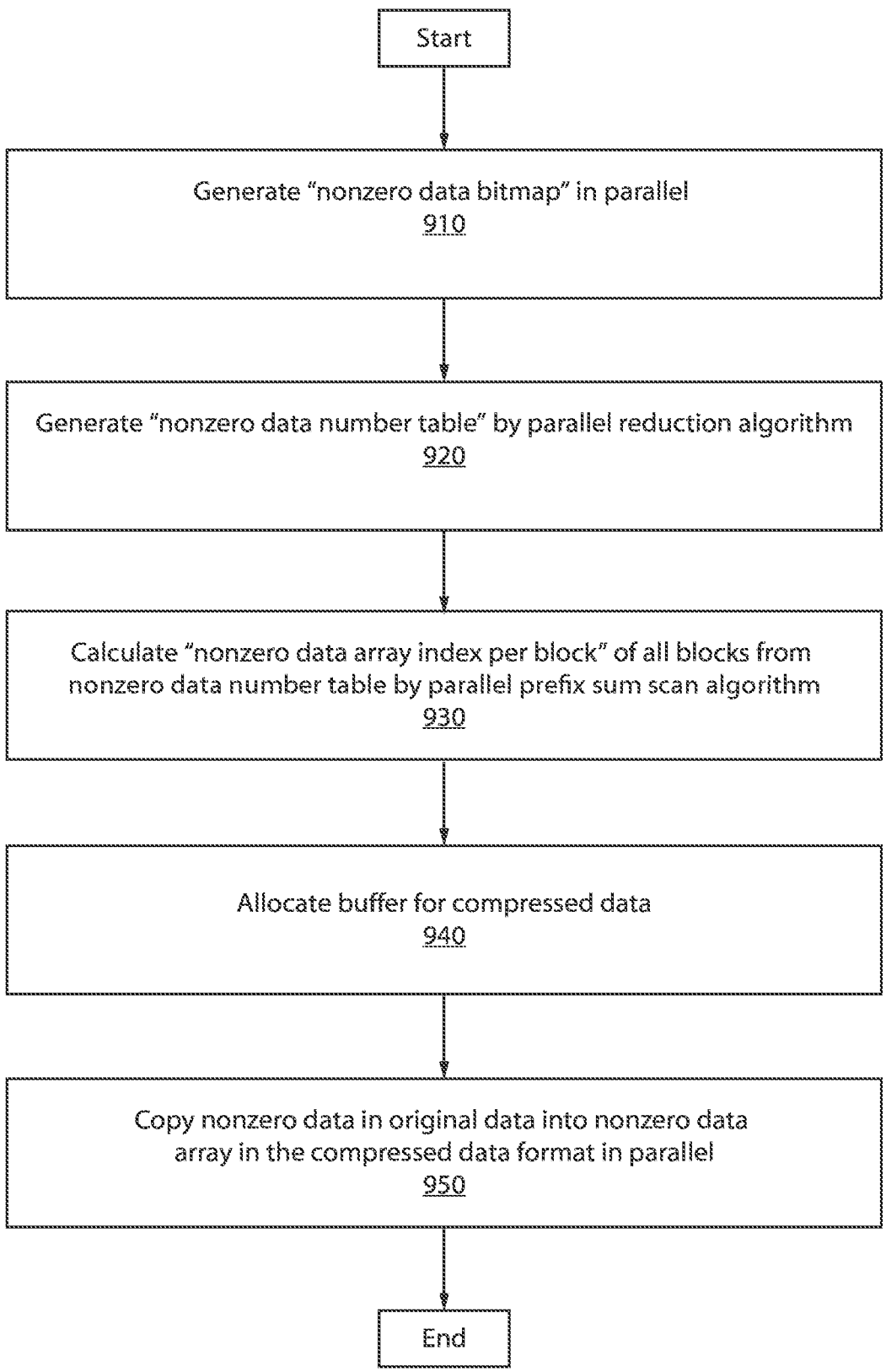
FIG. 9 is a block/flow diagram of a compression method for reducing GPU memory by rectified linear unit (ReLU) compression techniques, in accordance with an embodiment of the present invention.

FIG. 9 is a block/flow diagram of a compression method for reducing GPU memory by rectified linear unit (ReLU) compression techniques, in accordance with an embodiment of the present invention.

At block 910, generate a "nonzero data bitmap" region, in parallel.

At block 920, generate a "nonzero data number table" by employing a parallel reduction algorithm.

At block 930, calculate a "nonzero data array index per block" region of all blocks from the "nonzero data number table" by employing a parallel prefix sum scan algorithm.

At block 940, allocate the buffer for compressed data.

At block 950, copy nonzero data from the original data into a "nonzero data array" in the compressed data format, in parallel.

Figure 10:
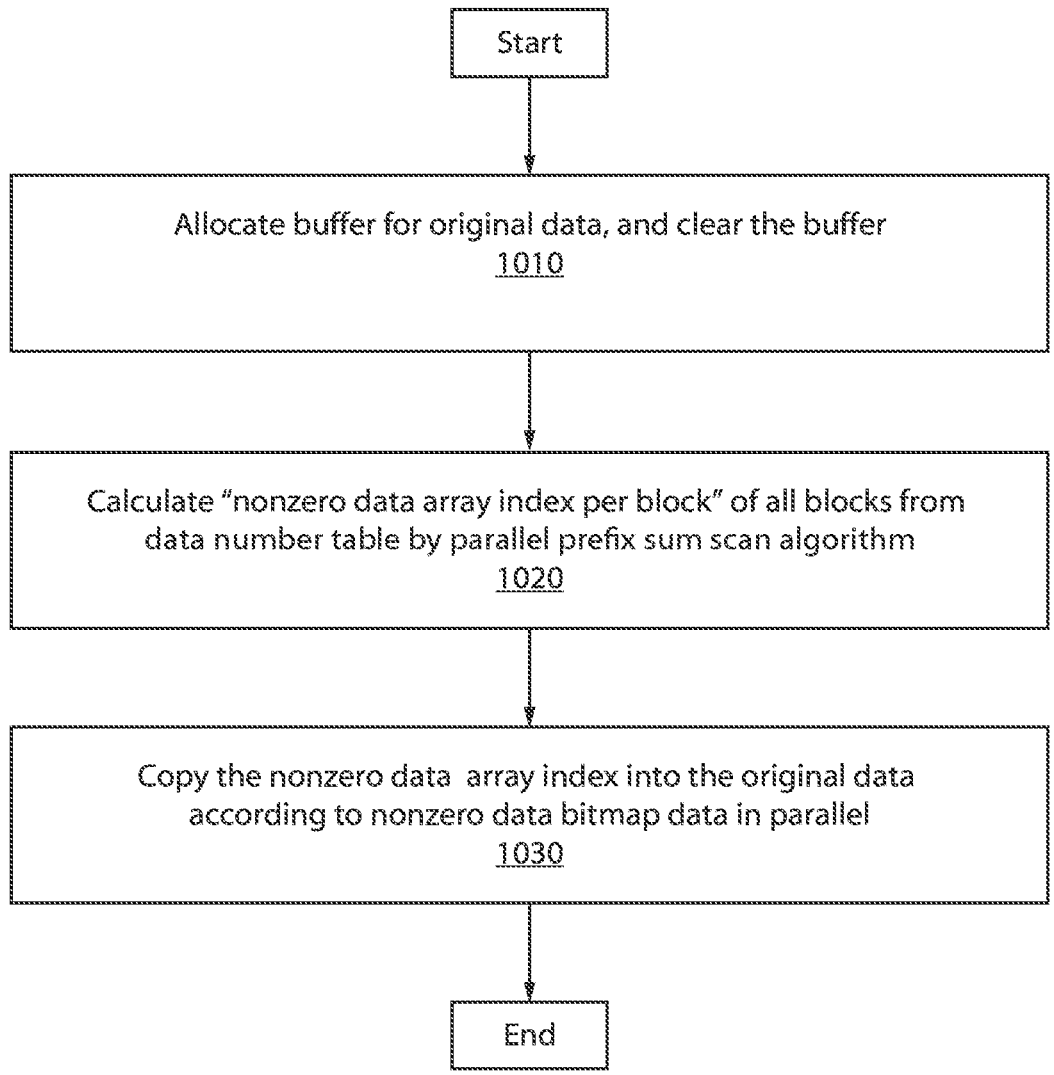
FIG. 10 is a block/flow diagram of a decompression method for reducing GPU memory by rectified linear unit (ReLU) compression techniques, in accordance with an embodiment of the present invention.

FIG. 10 is a block/flow diagram of a decompression method for reducing GPU memory by rectified linear unit (ReLU) compression techniques, in accordance with an embodiment of the present invention.

At block 1010, allocate the buffer from the original data, and clear the buffer.

At block 1020, calculate the "nonzero data array index per block" region of all blocks from the "nonzero data number table" by employing a parallel prefix sum scan algorithm.

At block 1030, copy the "nonzero data array" from the original data according to the "nonzero data bitmap," in parallel.

Therefore, in conclusion, a system is presented that includes outputs of a ReLU function on GPU, whose compression data includes "original data length," "nonzero data number table" indicating number of nonzero data per block, "nonzero data bitmap" indicating nonzero data positions, and "nonzero data array" for nonzero data from the original data.

The compression system generates the "nonzero data bitmap" in parallel, generates a "nonzero data number table" by employing a parallel reduction algorithm, calculates a "nonzero data array index per block" of all blocks from the nonzero data number table by employing a parallel prefix sum scan algorithm, allocates the buffer for compressed data, and copies nonzero data from the original data into a "nonzero data array," in parallel.

The decompression system allocates the buffer for original data, and clears the buffer, calculates "nonzero data array index per block" of all blocks from the "nonzero data number table" by employing a parallel prefix sum scan algorithm, and copies the "nonzero data array" from the original data according to the "nonzero data bitmap" data, in parallel.

Consequently, the exemplary embodiments of the present invention reduce GPU memory and several methods can be selected for each layer independently. In one method, ReLU compression is employed for GPU memory reduction where GPU memory is reduced by compressing feature maps generated by ReLU. In another exemplary embodiment, ReLU compression is employed with a recomputation method to compress GPU memory by compressing and saving feature maps generated by ReLU layers for starting points of recomputation, and discarding other feature maps. This method can reduce GPU memory size for saved feature maps by using ReLU's compression method. In yet another exemplary embodiment, ReLU compression is employed with a data swapping method to compress GPU memory by compressing feature maps on GPU generated by ReLU layers before transferring them into CPU memory. Thus, data transfer time from GPU to CPU can be efficiently reduced. This exemplary method transfers data from the CPU to the GPU, then decompresses the data.

Figure 11:
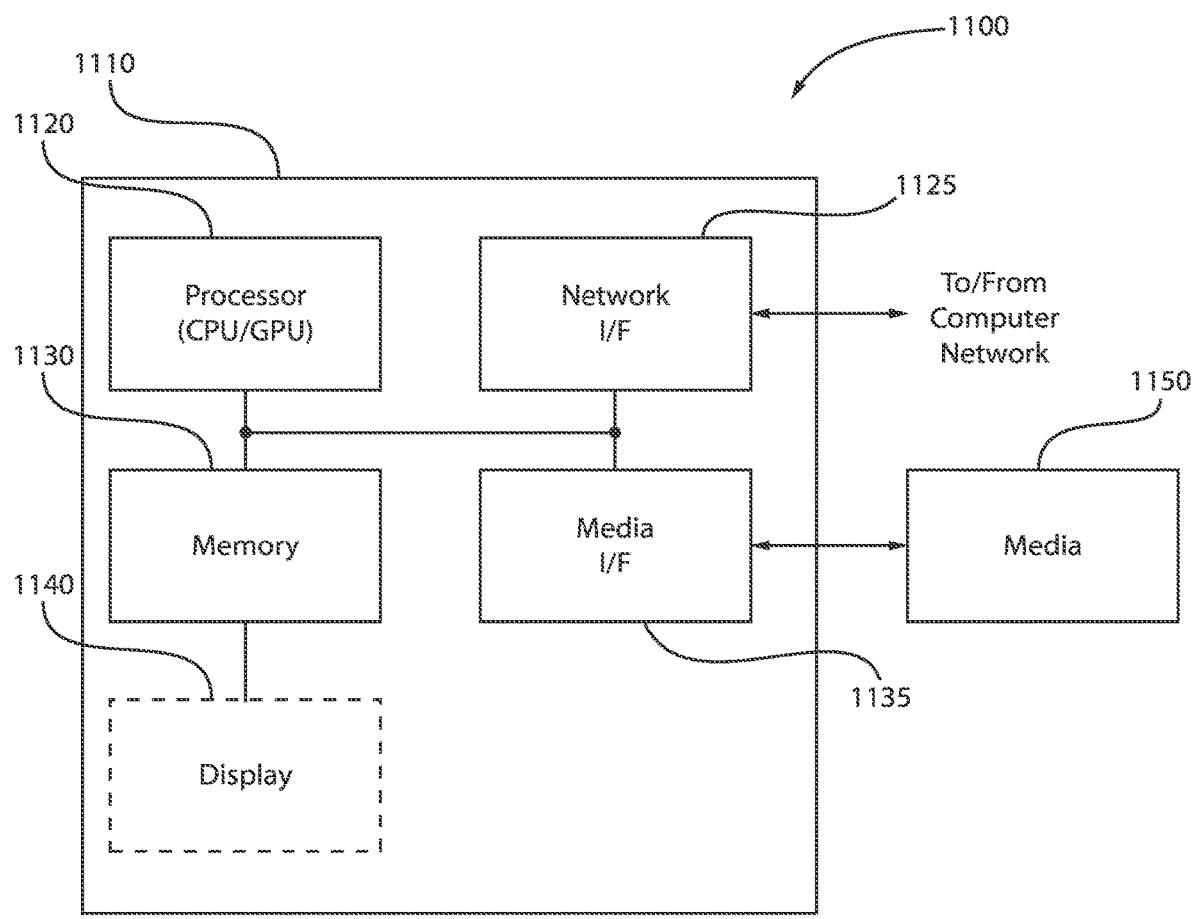
FIG. 11 is a block/flow diagram of a computing method for reducing GPU memory by rectified linear unit (ReLU) compression techniques, in accordance with an embodiment of the present invention.

FIG. 11 is a block/flow diagram of a computing method for reducing GPU memory by rectified linear unit (ReLU) compression techniques, in accordance with an embodiment of the present invention.

A block diagram is shown of an apparatus 1100 for implementing one or more of the methodologies presented herein.

Apparatus 1100 includes a computer system 1110 and removable media 1150. Computer system 1110 includes a CPU device and a GPU device collectively referred to as 1120, a network interface 1125, a memory 1130, a media interface 1135 and an optional display 1140. Network interface 1125 allows computer system 1110 to connect to a network, while media interface 1135 allows computer system 1110 to interact with media, such as a hard drive or removable media 1150.

CPU/GPU 1120 can be configured to implement the methods, steps, and functions disclosed herein. The memory 1130 could be distributed or local and the processor CPU/ GPU 1120 could be distributed or singular. The memory 1130 could be implemented as an electrical, magnetic or optical memory, or any combination of these or other types of storage devices. Moreover, the term "memory" should be construed broadly enough to encompass any information able to be read from, or written to, an address in the addressable space accessed by CPU/GPU 1120. With this definition, information on a network, accessible through network interface 1125, is still within memory 1130 because the processor device 1120 can retrieve the information from the network. It should be noted that each distributed processor that makes up CPU/GPU 1120 generally includes its own addressable memory space. It should also be noted that some or all of computer system 1110 can be incorporated into an application-specific or general-use integrated circuit.

Optional display 1140 is any type of display suitable for interacting with a human user of apparatus 1100. Generally, display 1140 is a computer monitor or other similar display.

Figure 12:
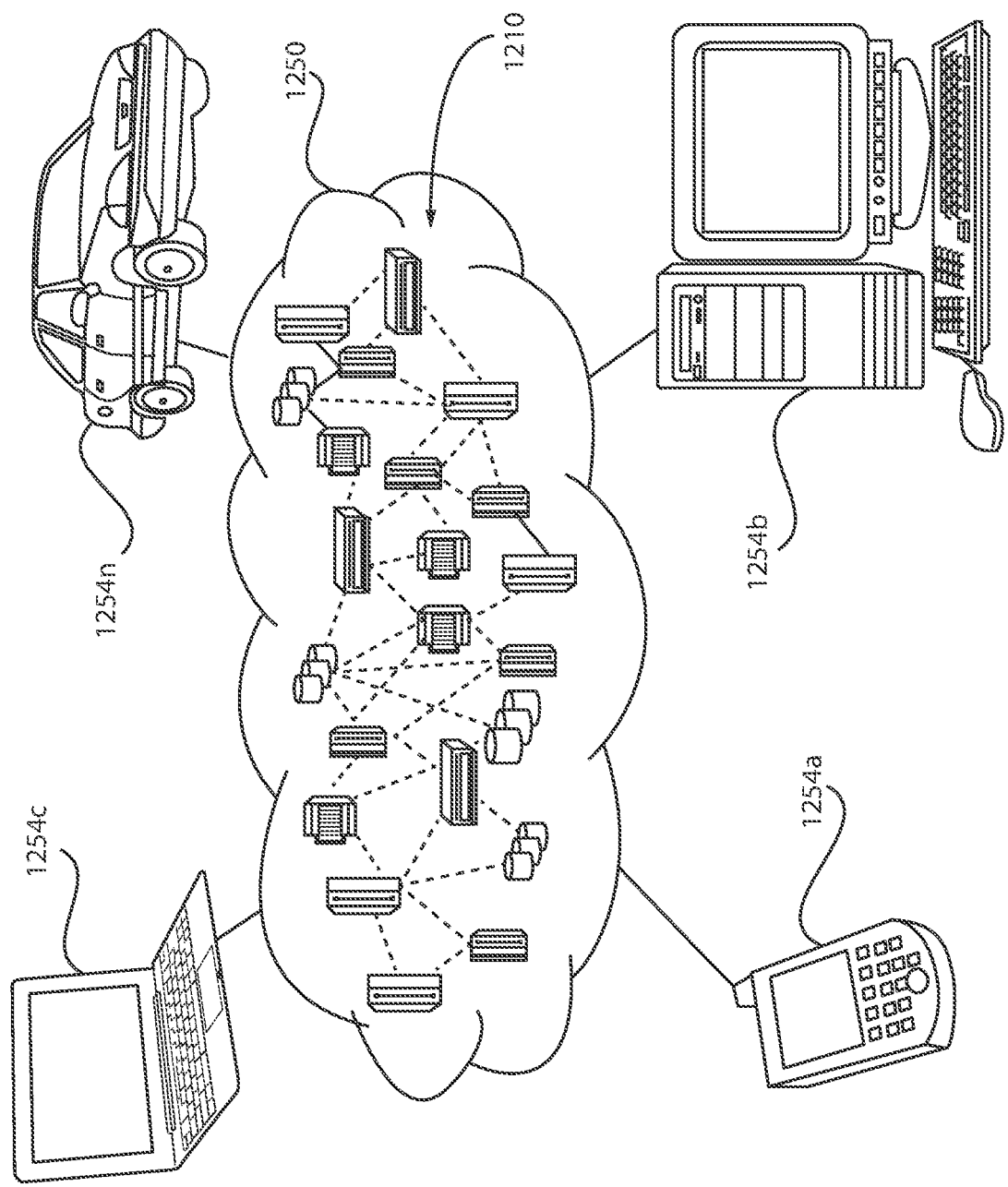
FIG. 12 is a block/flow diagram of an exemplary cloud computing environment, in accordance with an embodiment of the present invention.

FIG. 12 is a block/flow diagram of an exemplary cloud computing environment, in accordance with an embodiment of the present invention.

It is to be understood that although this invention includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model can include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but can be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It can be managed by the organization or a third party and can exist on-premises or off-premises.

Community cloud: the cloud infrastructure is shared by several organizations and supports a specific community that has shared concerns (e.g., mission, security requirements, policy, and compliance considerations). It can be managed by the organizations or a third party and can exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Referring now to FIG. 12, illustrative cloud computing environment 1250 is depicted for enabling use cases of the present invention. As shown, cloud computing environment 1250 includes one or more cloud computing nodes 1210 with which local computing devices used by cloud consumers, such as, for example, personal digital assistant (PDA) or cellular telephone 1254A, desktop computer 1254B, laptop computer 1254C, and/or automobile computer system 1254N can communicate. Nodes 1210 can communicate with one another. They can be grouped (not shown) physically or virtually, in one or more networks, such as Private, Community, Public, or Hybrid clouds as described herein-above, or a combination thereof. This allows cloud computing environment 1250 to offer infrastructure, platforms and/or software as services for which a cloud consumer does not need to maintain resources on a local computing device. It is understood that the types of computing devices 1254A-N shown in FIG. 12 are intended to be illustrative only and that computing nodes 1210 and cloud computing environment 1250 can communicate with any type of computerized device over any type of network and/or network addressable connection (e.g., using a web browser).

Figure 13:
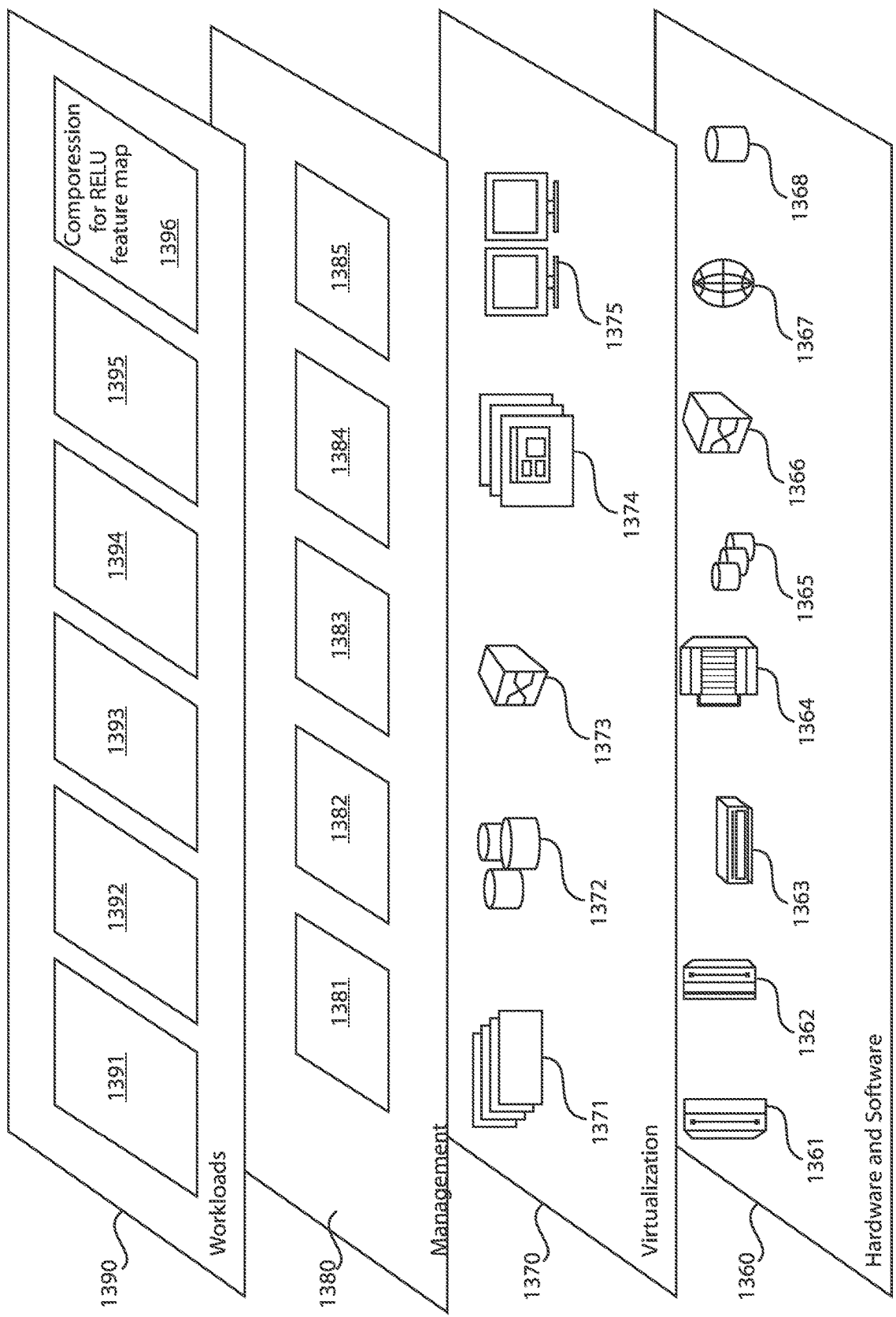
FIG. 13 is a schematic diagram of exemplary abstraction model layers, in accordance with an embodiment of the present invention.

FIG. 13 is a schematic diagram of exemplary abstraction model layers, in accordance with an embodiment of the present invention. It should be understood in advance that the components, layers, and functions shown in FIG. 13 are intended to be illustrative only and embodiments of the invention are not limited thereto. As depicted, the following layers and corresponding functions are provided:

Hardware and software layer 1360 includes hardware and software components. Examples of hardware components include: mainframes 1361; RISC (Reduced Instruction Set Computer) architecture based servers 1362; servers 1363; blade servers 1364; storage devices 1365; and networks and networking components 1366. In some embodiments, software components include network application server software 1367 and database software 1368.

Virtualization layer 1370 provides an abstraction layer from which the following examples of virtual entities can be provided: virtual servers 1371; virtual storage 1372; virtual networks 1373, including virtual private networks; virtual applications and operating systems 1374; and virtual clients 1375.

In one example, management layer 1380 can provide the functions described below. Resource provisioning 1381 provides dynamic procurement of computing resources and other resources that are utilized to perform tasks within the cloud computing environment. Metering and Pricing 1382 provide cost tracking as resources are utilized within the cloud computing environment, and billing or invoicing for consumption of these resources. In one example, these resources can include application software licenses. Security provides identity verification for cloud consumers and tasks, as well as protection for data and other resources. User portal 1383 provides access to the cloud computing environment for consumers and system administrators. Service level management 1384 provides cloud computing resource allocation and management such that required service levels are met. Service Level Agreement (SLA) planning and fulfillment 1385 provide pre-arrangement for, and procurement of, cloud computing resources for which a future requirement is anticipated in accordance with an SLA.

Workloads layer 1390 provides examples of functionality for which the cloud computing environment can be utilized. Examples of workloads and functions which can be provided from this layer include: mapping and navigation 1391; software development and lifecycle management 1392; virtual classroom education delivery 1393; data analytics processing 1394; transaction processing 1395; and a compression for ReLU feature map 1396 in cloud servers.

As used herein, the terms "data," "content," "information" and similar terms can be used interchangeably to refer to data capable of being captured, transmitted, received, displayed and/or stored in accordance with various example embodiments. Thus, use of any such terms should not be taken to limit the spirit and scope of the disclosure. Further, where a computing device is described herein to receive data from another computing device, the data can be received directly from the another computing device or can be received indirectly via one or more intermediary computing devices, such as, for example, one or more servers, relays, routers, network access points, base stations, and/or the like.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

The present invention can be a system, a method, and/or a computer program product. The computer program product can include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention can be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions can be provided to at least one processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks or modules. These computer readable program instructions can also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks or modules.

The computer readable program instructions can also be loaded onto a computer, other programmable data processing apparatus, or other device to cause a series of operational blocks/steps to be performed on the computer, other programmable apparatus or other device to produce a computer implemented process, such that the instructions which execute on the computer, other programmable apparatus, or other device implement the functions/acts specified in the flowchart and/or block diagram block or blocks or modules.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which includes one or more executable instructions for implementing the specified logical function(s). In some alternative implementations, the functions noted in the blocks can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

Having described preferred embodiments of a system and method for compressing data of a Rectified Linear Unit (ReLU) function on a graphical processing unit (GPU) employed in a learning process of a deep neural network (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for compressing data of a Rectified Linear Unit (ReLU) function on a graphical processing unit (GPU) employed in a learning process of a deep neural network, the method comprising:
converting an initial data structure including nonzero data and zero data into a compressed data structure including only the nonzero data of the initial data structure as compressed data by:
generating a nonzero data bitmap region;
generating a nonzero data number table region by employing a parallel reduction algorithm;
calculating a nonzero data array index per block region of all blocks from the nonzero data number table region by employing a parallel prefix sum scan algorithm;
allocating a buffer for the compressed data; and copying the nonzero data from the initial data structure into a nonzero data array region in a compressed data format in parallel.

2. The method of claim 1, wherein the compressed data is decompressed by allocating the buffer from the nonzero data and zero data of the initial data structure, and then clearing the buffer.

3. The method of claim 2, wherein the decompression further includes calculating the nonzero data array index per block region of all blocks from the nonzero data number table by employing the parallel prefix sum scan algorithm.

4. The method of claim 3, wherein the decompression further includes copying the nonzero data array from the initial data structure into the nonzero data bitmap region in parallel.

5. The method of claim 1, wherein the nonzero data bitmap region is displayed directly above the nonzero data array index per block region in the compressed data structure.

6. The method of claim 1, wherein the nonzero data number table region is displayed directly above the nonzero data bitmap region in the compressed data structure.

7. The method of claim 1, wherein the nonzero data bitmap region displays the uncompressed data in binary format in a sequential manner.

8. A non-transitory computer-readable storage medium comprising a computer-readable program for compressing data of a Rectified Linear Unit (ReLU) function on a graphical processing unit (GPU) employed in a learning process of a deep neural network, wherein the computer-readable program when executed on a computer causes the computer to:
convert an initial data structure including nonzero data and zero data into a compressed data structure including only the nonzero data of the initial data structure as compressed data by:
generate a nonzero data bitmap region;
generate a nonzero data number table region by employing a parallel reduction algorithm;
calculate a nonzero data array index per block region of all blocks from the nonzero data number table region by employing a parallel prefix sum scan algorithm;
allocate a buffer for the compressed data; and
copy the nonzero data from the initial data structure into a nonzero data array region in a compressed data format in parallel.

9. The non-transitory computer-readable storage medium of claim 8, wherein the compressed data is decompressed by allocating the buffer from the nonzero data and zero data of the initial data structure, and then clearing the buffer.

10. The non-transitory computer-readable storage medium of claim 9, wherein the decompression further includes calculating the nonzero data array index per block region of all blocks from the nonzero data number table by employing the parallel prefix sum scan algorithm.

11. The non-transitory computer-readable storage medium of claim 10, wherein the decompression further includes copying the nonzero data array from the initial data structure into the nonzero data bitmap region in parallel.

12. The non-transitory computer-readable storage medium of claim 8, wherein the nonzero data bitmap region is displayed directly above the nonzero data array index per block region in the compressed data structure.

13. The non-transitory computer-readable storage medium of claim 8, wherein the nonzero data number table region is displayed directly above the nonzero data bitmap region in the compressed data structure.

14. The non-transitory computer-readable storage medium of claim 8, wherein the nonzero data bitmap region displays the uncompressed data in binary format in a sequential manner.

15. A system for compressing data of a Rectified Linear Unit (ReLU) function on a graphical processing unit (GPU) employed in a learning process of a deep neural network, the system comprising:
a memory; and
one or more processors in communication with the memory configured to:
convert an initial data structure including nonzero data and zero data into a compressed data structure including only the nonzero data of the initial data structure as compressed data by:
generating a nonzero data bitmap region;
generating a nonzero data number table region by employing a parallel reduction algorithm;
calculating a nonzero data array index per block region of all blocks from the nonzero data number table region by employing a parallel prefix sum scan algorithm;
allocating a buffer for the compressed data; and
copying the nonzero data from the initial data structure into a nonzero data array region in a compressed data format in parallel.

16. The system of claim 15, wherein the compressed data is decompressed by allocating the buffer from the nonzero data and zero data of the initial data structure, and then clearing the buffer.

17. The system of claim 16, wherein the decompression further includes calculating the nonzero data array index per block region of all blocks from the nonzero data number table by employing the parallel prefix sum scan algorithm.

18. The system of claim 17, wherein the decompression further includes copying the nonzero data array from the initial data structure into the nonzero data bitmap region in parallel.

19. The system of claim 15, wherein the nonzero data bitmap region is displayed directly above the nonzero data array index per block region in the compressed data structure.

20. The system of claim 15,
wherein the nonzero data number table region is displayed directly above the nonzero data bitmap region in the compressed data structure; and
wherein the nonzero data bitmap region displays the uncompressed data in binary format in a sequential manner.

* * * * *